(12) United States Patent
Slade (10) Patent No.: US 11,193,996 B2
(45) Date of Patent: Dec. 7, 2021

(54) CRYOGENIC MAGNET POWER SUPPLY

(71) Applicant: Tokamak Energy Ltd., Abingdon (GB)

(72) Inventor: Robert Slade, Abingdon (GB)

(73) Assignee: Tokamak Energy Ltd., Abingdon (GB)

( * ) Notice: Subject to any disclaimer, the term of this patent is extended or adjusted under 35 U.S.C. 154(b) by 269 days.

(21) Appl. No.: 16/482,782

(22) PCT Filed: Feb. 7, 2018

(86) PCT No.: PCT/GB2018/050337
§ 371 (c)(1),
(2) Date: Aug. 1, 2019

(87) PCT Pub. No.: WO2018/146464
PCT Pub. Date: Aug. 16, 2018

(65) Prior Publication Data
US 2020/0225301 A1 Jul. 16, 2020

(30) Foreign Application Priority Data
Feb. 9, 2017 (GB) ..................... 1702134

(51) Int. Cl.
*H01F 6/00* (2006.01)
*G01R 33/3815* (2006.01)
(Continued)

(52) U.S. Cl.
CPC ......... *G01R 33/3815* (2013.01); *H01F 6/008* (2013.01); *H01F 6/04* (2013.01);
(Continued)

(58) Field of Classification Search
CPC ....... H01F 6/008; H01F 6/06; G01R 33/3815; H02H 7/001; H02H 9/023
See application file for complete search history.

(56) References Cited

U.S. PATENT DOCUMENTS 4,122,512 A * 10/1978 Peterson ............... H02M 7/757
363/14
4,906,861 A * 3/1990 Roy ........................ H01L 39/20
307/138

(Continued)

FOREIGN PATENT DOCUMENTS

GB 2457706 A 8/2009
JP 2000133513 A 5/2000
(Continued)

OTHER PUBLICATIONS

Search Report issued from the United Kingdom Patent Office for related Application No. GB1702134.6 dated Jun. 14, 2017 (4 pages).

(Continued)

*Primary Examiner* — Scott Bauer
(74) *Attorney, Agent, or Firm* — Michael Best & Friedrich LLP (57) ABSTRACT

There is described a magnet assembly comprising a superconducting coil, a cryogenic system, a DC voltage source, an SMPS, current leads, and a controller. The cryogenic system comprises a cryostat and is configured to maintain the superconducting coil at an operating temperature below the critical temperature of the superconductor. The DC voltage is source located outside the cryostat. The SMPS is located inside the cryostat and configured to supply power from the DC voltage source to the superconducting coil. The SMPS comprises a voltage step-down transformer having a primary and a secondary winding. The current leads connect the DC voltage source to the SMPS. The controller is configured to cause the SMPS to supply a first amount of power to the magnet in order to ramp up the magnet to operating current, and a second amount of power to the magnet during steady (Continued)

state operation of the magnet, wherein the first amount of power is greater than the second amount of power.

24 Claims, 5 Drawing Sheets

(51) Int. Cl.
*H01F 6/04* (2006.01)
*H01F 6/06* (2006.01)
*H02H 7/00* (2006.01)
*H02H 9/02* (2006.01)

(52) U.S. Cl.
CPC ............... *H01F 6/06* (2013.01); *H02H 7/001* (2013.01); *H02H 9/023* (2013.01); *H01F 6/065* (2013.01)

(56) References Cited

U.S. PATENT DOCUMENTS

| | | | | |
|---|---|---|---|---|
| 5,805,036 | A * | 9/1998 | Hodge | H01L 39/20 174/125.1 |
| 5,965,959 | A * | 10/1999 | Gamble | H01F 6/005 307/125 |
| 6,157,094 | A | 12/2000 | Gamble et al. | |
| 6,879,852 | B1 | 4/2005 | Mueller | |
| 6,977,571 | B1 | 12/2005 | Hollis et al. | |
| 2007/0108956 | A1* | 5/2007 | Steigerwald | H02M 3/3353 323/288 |
| 2009/0212891 | A1* | 8/2009 | Hickman | H01F 6/006 335/216 |
| 2013/0300417 | A1 | 11/2013 | Malaney et al. | |
| 2014/0235451 | A1 | 8/2014 | Uglietti et al. | |
| 2016/0343491 | A1 | 11/2016 | Miyazoe et al. | |

FOREIGN PATENT DOCUMENTS

| | | |
|---|---|---|
| JP | 2009033014 A | 2/2009 |
| JP | 2014007792 A | 1/2014 |
| WO | 96/24939 A1 | 8/1996 |
| WO | 2009/104116 A1 | 8/2009 |

OTHER PUBLICATIONS

International Search Report with Written Opinion for related Application No. PCT/GB2018/050337 dated May 17, 2018 (10 pages).
International Preliminary Report on Patentability for related Application No. PCT/GB2018/050337 dated Apr. 24, 2019 (23 pages).
Bumby et al., "Frequency Dependent Behavior of a Dynamo-Type HTS Flux Pump", IEEE Transactions on Applied Superconductivity, vol. 27, No. 4, 2016, pp. 1-5.
Coombs et al., "An Overview of Flux Pumps for HTS Coils", IEEE Transactions on Applied Superconductivity, 2016, pp. 1-5.
Mueller et al., "Cryo-MOSFET and IGBT: a Comparison", Journal de Physique IV Colloque, 1996, vol. 6, pp. C3-219-C3-224.
Oomen et al., "HTS Flux Pump for Cryogen-Free HTS Magnets", IEEE Transactions on Applied Superconductivity, vol. 15, No. 2, 2005, pp. 1465-1468.
Swallom et al., "Lightweigh Transformer", AVCO Research Laboratory, Report prepared for U.S. Department of Energy, May 1990, 87 pages.
HK PolyU, "Zero-Current Switching Quasi-resonant Converters", Power Electronics, 2020, 20 pages.
Wurth Elektronik, "SMPS Topology Chart", <https://www.we-online.com/web/en/index.php/show/media/07_electronic_components/news_1/blog/midcom_blog_photos/SMPSChart.pdf>, accessed 2017, 1 page.

* cited by examiner

CRYOGENIC MAGNET POWER SUPPLY

FIELD OF THE INVENTION

The invention relates to power supplies for superconducting magnets.

BACKGROUND

A superconducting magnet is an electromagnet formed from coils of a superconducting material. As the magnet coils have zero resistance, superconducting magnets can carry high currents with zero loss (though there will be some losses from non-superconducting components), and can therefore reach high fields with lower losses than conventional electromagnets.

Superconductivity only occurs in certain materials, and only at low temperatures. A superconducting material will behave as a superconductor in a region defined by the critical temperature of the superconductor (the highest temperature at which the material is a superconductor in zero applied magnetic field) and the critical field of the superconductor (the highest magnetic field in which the material is a superconductor at 0K). The temperature of the superconductor and the magnetic field present limit the current which can be carried by the superconductor without the superconductor becoming resistive (or "normal", used herein to mean "not superconducting"). There are two types of superconducting material: type I superconductors totally exclude magnetic flux penetration and have a low critical field, type II allow flux to penetrate the superconductor above the lower critical field within localized normal regions called flux vortices. They cease to be superconducting at the upper critical field. This feature enables them to be used in wires for construction of superconducting magnets. Significant effort is made to pin the flux vortex sites to the atomic lattice, which improves critical current at higher magnetic fields and temperatures.

Broadly speaking, there are two categories of type II superconductors. Low temperature superconductors (LTS) typically have critical temperatures (with no external magnetic field) below 20K, and high temperature superconductors (HTS) typically have critical temperatures above 40K. Many current HTS materials have critical temperatures above 77K, which allows the use of liquid nitrogen for cooling.

However, it will be appreciated by those skilled in the art that LTS and HTS are differentiated by criteria other than critical temperature, and that HTS and LTS are terms of the art for certain classes of materials. In general (though not exclusively), HTS materials are ceramics, and LTS materials are metallic.

One application of HTS magnets is in tokamak fusion reactors. A tokamak features a combination of strong toroidal magnetic field, high plasma current and, usually, a large plasma volume and significant auxiliary heating, to provide a hot stable plasma so that fusion can occur. The auxiliary heating (for example via tens of megawatts of neutral beam injection of high energy H, D or T) is necessary to increase the temperature to the sufficiently high values required for nuclear fusion to occur, and/or to maintain the plasma current.

To obtain the fusion reactions required for economic power generation (i.e. much more power out than power in), the conventional tokamak has to be huge so that the energy confinement time (which is roughly proportional to plasma volume) can be large enough so that the plasma can be hot enough for thermal fusion to occur.

WO 2013/030554 describes an alternative approach, involving the use of a compact spherical tokamak for use as a neutron source or energy source. The low aspect ratio plasma shape in a spherical tokamak improves the particle confinement time and allows net power generation in a much smaller machine. However, a small diameter central column is a necessity, which presents challenges for design of the plasma confinement magnet.

The primary attraction of HTS for tokamaks is the ability of HTS to carry high currents in intense magnetic fields. This is particularly important in compact spherical tokamaks (STs), in which the flux density on the surface of the centre column will exceed 20 T. A secondary benefit is the ability of HTS to carry high current in high magnetic field at higher temperatures than LTS, for example ~20 K. This enables use of a thinner neutron shield, resulting in higher neutron heating of the central column, which would preclude operation using liquid helium (ie: at 4.2 K or below). This in turn enables the design of a spherical tokamak with major plasma radius of less than about 2 m, for example about 1.4 m to be considered; such a device would recycle a few percent of its power output for cryogenic cooling.

Nevertheless, such magnets are much bigger than those previously designed using HTS material. The toroidal field (TF) magnet for even a relatively small tokamak would be, by far, the largest HTS magnet built to date, and represents a large magnet with high stored energy even by LTS standards.

Energising such a magnet presents a significant technical challenge. The transport current in a large HTS magnet can be 50-150 kA. Even magnets with a higher number of turns (and therefore a lower current, but higher inductance) may still have a transport current in excess of 20 kA. This current must be brought in from outside the cryostat. In known magnets, this is typically done by the use of current leads passing through the cryostat—but for such high currents the size of current lead required results in them being very bulky and expensive. This is especially the case where current needs to be routed from a power supply at room temperature to a magnet at temperatures of a few Kelvin, or even a few tens of Kelvin.

It is therefore an objective of this invention to reduce the size of the current leads, and their associated cost, complexity and heat leak to the magnet's cryogenic environment.

It is desirable to manufacture the superconducting magnet with demountable joints in each turn, for ease of repair, maintenance and replacement of coil sections after exposure to neutron irradiation. These joints will have a small resistance (of order nanoohms). A superconducting magnet with resistive joints will consume a small amount of power when operational—on the order of a few kilowatts. Therefore, any power supply must be able to supply this to the magnet long-term. However, ramping up an HTS magnet with ~2 GJ of stored energy using this low power would take weeks, so a power supply which can deliver both low and high power is desirable.

SUMMARY

According to a first aspect of the present invention, there is provided a magnet assembly. The magnet assembly comprises a superconducting coil, a cryogenic system, a DC voltage source, a switched mode power supply (SMPS), current leads, and a controller. The cryogenic system comprises a thermally insulated cryostat and a source of cooling power configured to maintain the superconducting coil at an operating temperature below the critical temperature of the superconductor. The DC voltage is a source located outside the cryostat. The SMPS is located inside the cryostat, cooled to the same (or nearly the same) temperature as the magnet and configured to supply power from the DC voltage source to the superconducting coil. The SMPS comprises a voltage step-down transformer having a primary and a secondary winding. The current leads connect the DC voltage source to the SMPS. The controller is configured to cause the SMPS to supply a first amount of power to the magnet in order to ramp up the magnet to operating current, and a second amount of power to the magnet during steady state operation of the magnet, wherein the first amount of power is greater than the second amount of power.

According to a second aspect of the invention, there is provided a magnet assembly. The magnet assembly comprises a superconducting coil, a cryogenic system, a DC voltage source, an SMPS, current leads, and a controller. The cryogenic system is configured to maintain the superconducting coil at an operating temperature below the critical temperature of the superconductor. The DC voltage source located at room temperature. The SMPS configured to supply power from the DC voltage source to the superconducting coil. The SMPS comprises a voltage step-down transformer having a primary and a secondary winding. The SMPS is located in a region of the cryogenic system which is at a temperature less than room temperature and greater than or equal to the critical temperature of the superconductor during operation of the cryogenic system. A first set of current leads connect the DC voltage source to the SMPS and a second set connect the SMPS to the magnet. Each set of leads supports a temperature gradient. The controller is configured to cause the SMPS to supply a first amount of power to the magnet in order to ramp up the magnet to operating current, and a second amount of power to the magnet during steady state operation of the magnet, wherein the first amount of power is greater than the second amount of power.

According to a third aspect of the invention, there is provided a magnet assembly. The magnet assembly comprises a superconducting coil, a cryogenic system, a DC voltage source, an SMPS, current leads, and a controller. The cryogenic system comprises a cryostat and is configured to maintain the superconducting coil at an operating temperature below the critical temperature of the superconductor. The DC voltage source is located at room temperature. The SMPS is configured to supply power from the DC voltage source to the superconducting coil. The SMPS comprises a step-down transformer having a primary and a secondary winding, wherein the primary winding is located outside the cryostat and the secondary winding is located inside the cryostat. The current leads connect the secondary winding to the magnet. The controller is configured to cause the SMPS to supply a first amount of power to the magnet in order to ramp up the magnet to operating current, and a second amount of power to the magnet during steady state operation of the magnet, wherein the first amount of power is greater than the second amount of power.

According to a fourth aspect of the invention, there is provided a method of providing power to a superconducting coil of a magnet assembly. The magnet assembly comprises a cryostat in which the superconducting coil is provided. An SMPS is provided, wherein the SMPS comprises a transformer having a primary winding and a secondary winding, and the secondary winding is inside a cryostat of the magnet assembly. The magnet is powered up by supplying a first amount of power from a DC voltage source outside the cryostat to the coil via the SMPS. Steady state operation of the magnet is maintained by supplying a second amount of power from the DC voltage source to the coil via the SMPS. The first amount of power is greater than the second amount of power.

The superconducting coil may include High Temperature Superconductor (HTS) material.

Further embodiments are presented in claim 2 et seq.

DETAILED DESCRIPTION

Rather than attempting to supply the full magnet transport current through the cryostat, a system is presented below to supply a much lower current (at higher voltage) to a switched mode power supply (SMPS) located within the cryostat, which incorporates a step-down transformer and a rectifier which then supplies the required high transport current to the magnet. The magnet itself is a superconducting magnet which comprises HTS, LTS, or a combination of the two. The resistive current leads connecting the DC power source outside the cryostat can therefore be reduced in diameter, since they need to carry lower current, reducing cost associated with the current leads themselves and the cryogenic system required to remove heat leak introduced by them. The current leads from the SMPS to the magnet will be cold, and made from superconductor.

Various SMPS topologies are suitable for this application. A suitable SMPS must incorporate a transformer with a large voltage step-down ratio. While such SMPS topologies are generally referred to as "isolated", the transformer can be a transformer with isolated or un-isolated windings (e.g. with a shared ground). A high flux coupling coefficient between the primary and secondary windings of the transformer is desirable. The SMPS will generally comprise one or more inductors, which act as energy storage devices (in this embodiment the magnet itself is the inductor), an active switch controlled by an external gate signal (usually implemented as a solid-state switch/transistor such as a MOSFET or IGBT or an array of solid-state switches) and one or more passive switches to rectify output current, typically in the form of diodes. The diodes may be replaced by active switches, such as MOSFETs or IGBTs.

Figure 1:
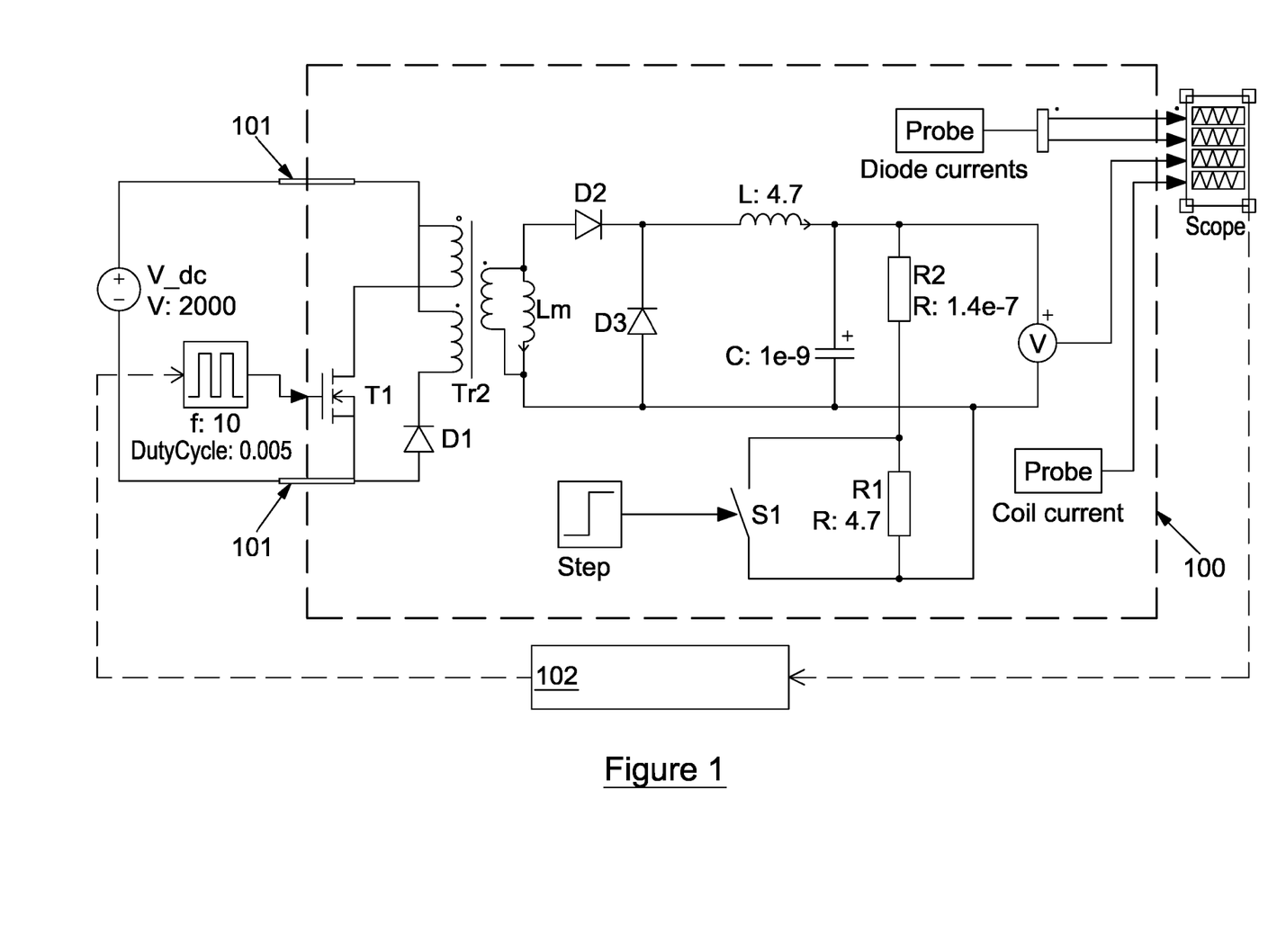
FIG. 1 is a schematic of a power supply according to an embodiment.

One possibility, as shown schematically in FIG. 1, is to use a forward convertor, although it will be appreciated that this topology is described by way of example only and the design considerations below will apply to any suitable topology. In FIG. 1, a boundary 100 represents the cryostat—anything within this boundary 100 is located in a cryogenic environment at 77K or lower. Only the DC power supply V_dc is located outside of the cryostat, and this is connected to the SMPS by current leads 101. The resistance R2 is simply the resistance of the magnet. In an ideal magnet, this would be zero, but in a magnet with joints between superconducting sections or other slightly resistive features, this is likely to be on the order of a few hundred nano-ohms. The inductance, L, would normally be a separate component of the SMPS, but in this case the inductance of the magnet itself can be used. Similarly, the capacitance C may just be the self capacitance of the magnet. The resistance R1 and switch S1 model an active "quench protection" system for the magnet, which dumps the stored energy of the magnet into resistive load R1 by opening switch S1 if a localized quench in the magnet is detected. The secondary winding of the transformer Tr2 and connecting wires within the cryostat can be manufactured from superconductor, preferably HTS (even if the magnet itself is LTS—as the SMPS may be at a higher temperature). The primary winding may be superconductor or copper. The SMPS includes a controller 102 which controls the duty cycle of the switch T1, as described in more detail below. The controller is shown outside the cryostat in FIG. 1, but it may be located within the cryostat.

FIG. 1 includes figures representing properties of an exemplary system for use with a superconducting magnet providing toroidal field to a tokamak. It will be understood that these figures are provided by way of example only for an embodiment, and should not be considered limiting.

Figure 2A:
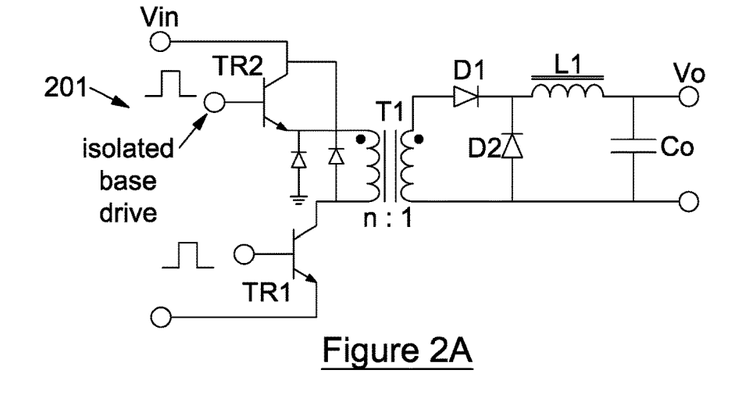
FIGS. 2A to 2D show exemplary SMPS topologies.
Figure 2B:
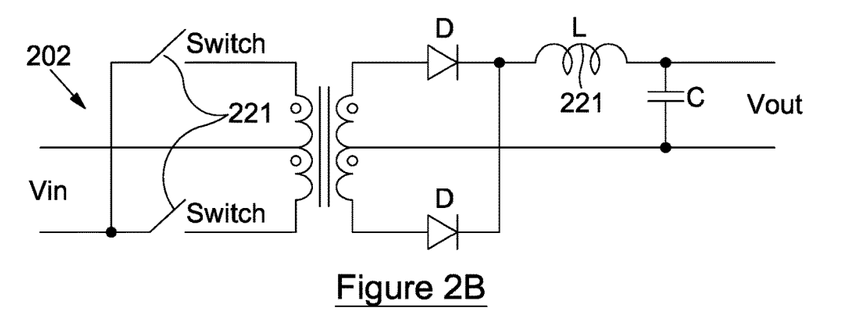
Figure 2C:
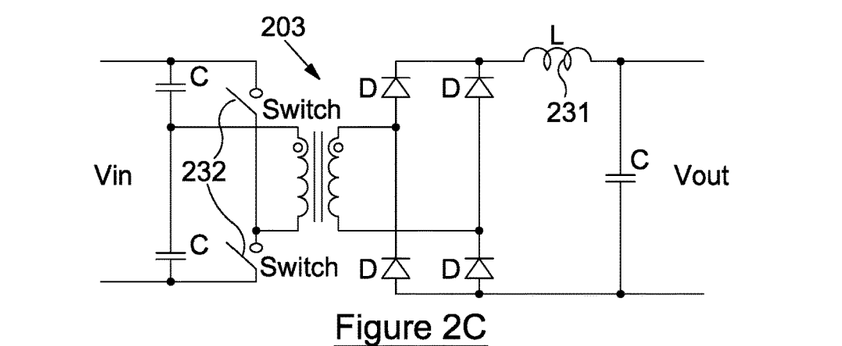
Figure 2D:
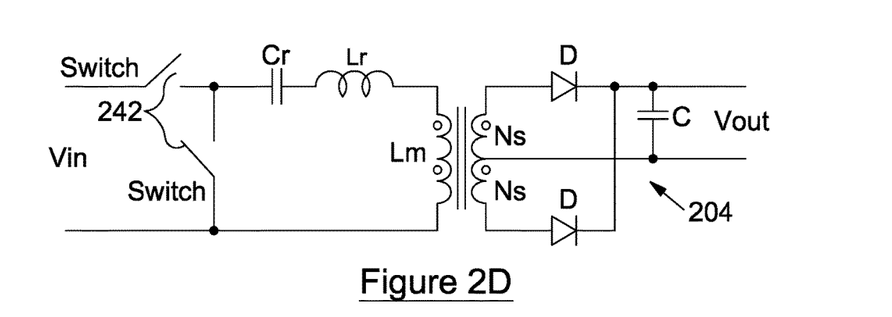

Other exemplary SMPS topologies are shown in FIGS. 2A to 2D. FIG. 2A shows a two-switch forward converter 201. FIG. 2B shows a push-pull converter 202. FIG. 2C shows a half-bridge converter 203. FIG. 2D shows a resonant LLC converter 204. In FIGS. 2B and 2C, the inductor L 221, 231 may be the magnet itself. In FIG. 2D, the magnet would be a part of the load (as the resonant LLC converter shown does not use an inductor on the secondary side). FIGS. 2B, 2C and 2D show switches 222, 232, 242, but these may be replaced with transistors or equivalent solid-state components. Other SMPS topologies incorporating a transistor may also be used.

The various SMPS components are expected to operate at cryogenic temperatures. Cryogenic switches are well known (e.g. superconducting switches which act by deliberately quenching a section of superconductor), but are slow and bulky. Semiconductor components (i.e. the diodes D1 to D3, and the switch T1 of FIG. 1, a transistor or more likely a transistor array) have been shown to work well at cryogenic temperatures down to 20K—indeed, they generally have better performance than at room temperature, and are therefore a preferred option for a cryogenic PSU.

The transformer Tr2 operates in the same way as in a typical forward convertor, although it is likely that either both windings or at least the secondary may be made from superconductor, preferably HTS, to minimise resistive losses. The AC losses can be minimised by using a low switching frequency. In a conventional SMPS, the switching frequency would be between 20 kHz and 500 kHz, to allow the use of a small inductor. Because the inductor in this case is a high powered superconducting magnet, with an inductance of a few Henries (e.g. ~4.7 H for a 1.4 m major radius TF magnet with 72 turns per coil at 28 kA), the operating frequency can be much lower, e.g. less than or equal to 1 kHz, less than or equal to 100 Hz, or less than or equal to 10 Hz. The switching frequency may be chosen to minimise the total AC power loss in the superconducting transformer and magnet, and the eddy current and hysteresis losses in the core of the transformer. However, low frequencies will require a larger core for the transformer to operate efficiently.

A suitable coil ratio for the transformer will depend on the input voltage provided by the DC power supply V_dc. In order to approach 100% flux linkage for the transformer, the primary and secondary windings may be co-wound. The windings may be linked by a material with high magnetic permeability, such as iron or ferrite. Use of such material would require the transformer to be shielded from the stray field of the magnet, but in the case of the tokamak plasma confinement magnet, this is simple, as the toroidal geometry is inherently self-shielded and generates very little magnetic field outside the magnet. However, this is not the case for the poloidal coils also needed in a fusion tokamak. If a core is used, the appropriate choice of material will depend on the choice of switching frequency. A higher switching frequency (e.g. >1 kHz) may benefit from the use of ferrite over iron, due to the reduction in eddy current losses. Alternatively, the transformer may be "air cored", i.e. without a solid core.

As an alternative to providing current leads passing through the cryostat, the transformer of the SMPS may be arranged such that the primary winding (connected to the DC voltage source V_dc) is outside the cryostat, and the secondary winding (connected to the magnet) is inside the cryostat. All of the SMPS components on the primary side would then be outside the cryostat (e.g. the switch T1 for the forward convertor) and all of the SMPS components on the secondary side would be inside the cryostat. The transformer may be air cored, which would result in negligible additional heat flow through the cryostat due to the SMPS but the transformer would have poor power transfer due to the low magnetic flux coupling. The poor power transfer may be improved by using a resonant transformer (i.e. one which uses resonant inductive coupling) as known in the art, e.g. https://en.wikipedia.org/wiki/Resonant_inductive_coupling. Alternatively, the transformer may have a solid core (as described above) which passes through the cryostat wall.

Figure 3:
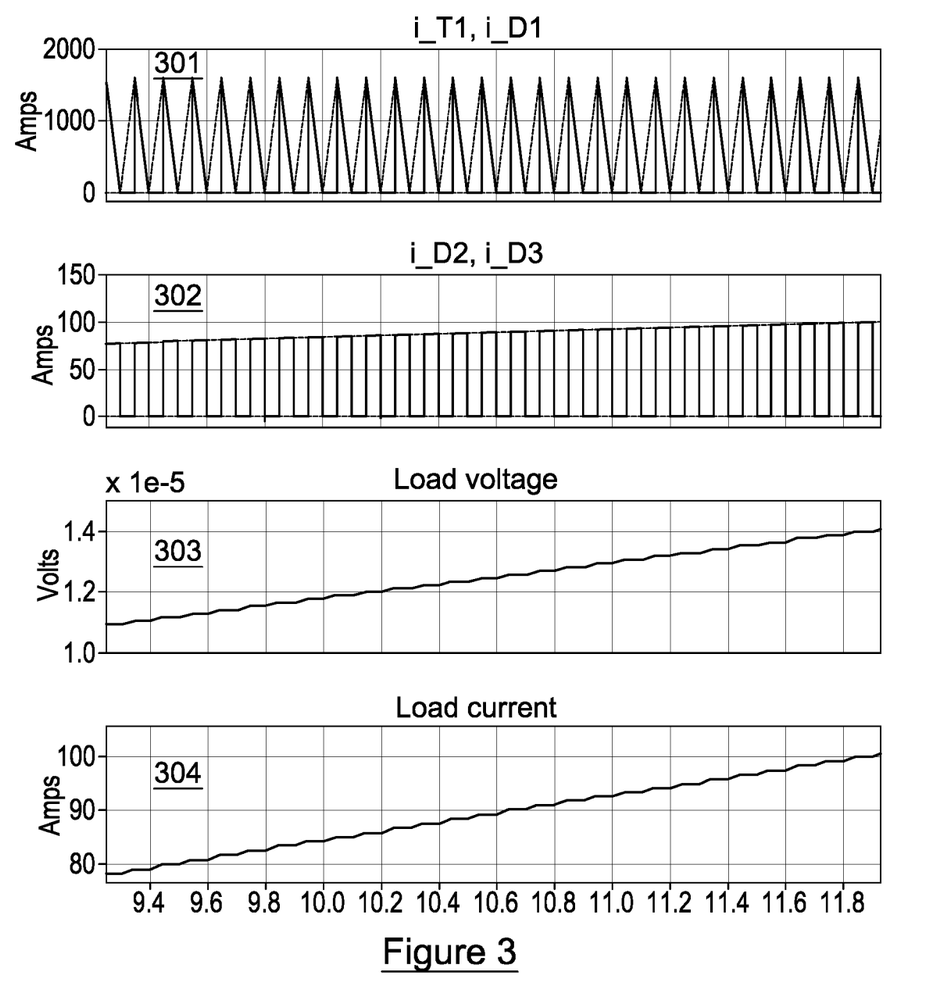
FIGS. 3 and 4 are graphs of properties of the power supply of FIG. 1.
Figure 4:
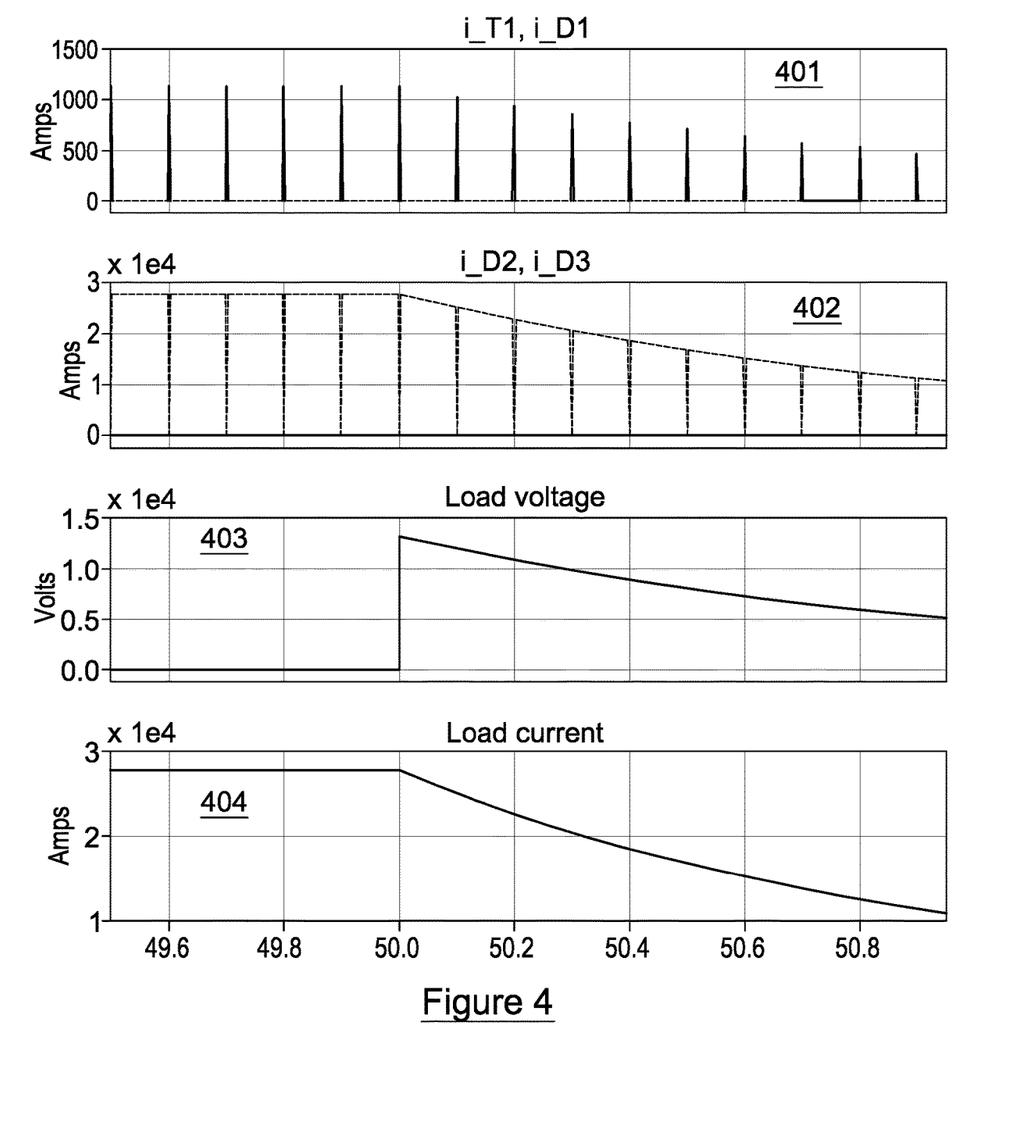

FIGS. 3 and 4 show various results from a simulation of the circuit shown in FIG. 1, with an input DC current of 2 kV, a 25:1 turn ratio in the transformer, and a 10 Hz switching frequency with 50% duty cycle during ramp-up (FIG. 3) and a 0.5% duty cycle during steady state operation (FIG. 4 at t<50). The graphs show:

301, 401 the current in each of the transistor T1 and diode D1 (i.e. through each input coil of the transformer Tr2);
    302, 402 the current in each of the diode D2 and diode D3 (i.e. through the output coil of the transformer Tr2);
    the current in 303, 403 and voltage across 304, 404 the magnet coil All of these values are used by way of example only. FIG. 3 shows the magnet during ramp-up. Each pulse of the switch increases the current in the magnet—at a rate of about 8 A/s. Because the resistance R2 is so small, there is only negligible decay in the magnet current when the switch T1 is off. FIG. 4 shows the magnet during a quench, which occurs at time t=50.

Figure 5:
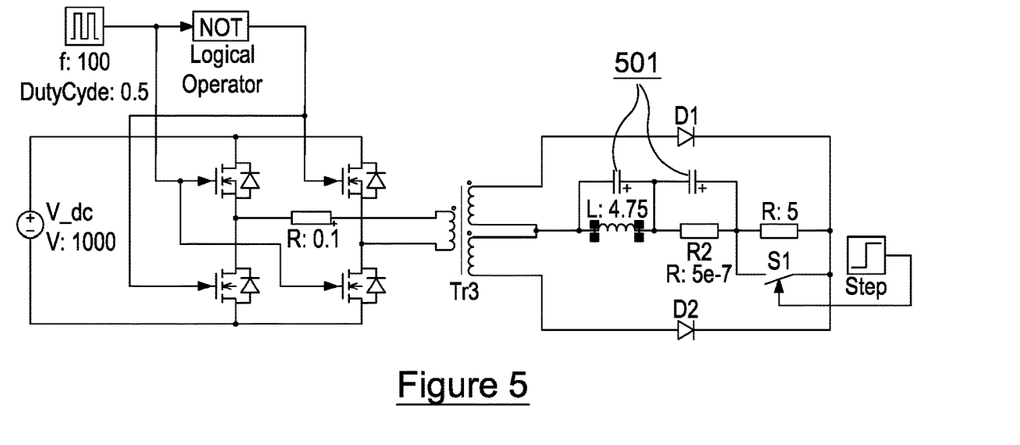
FIG. 5 is a schematic of a power supply according to a further embodiment.
Figure 6:
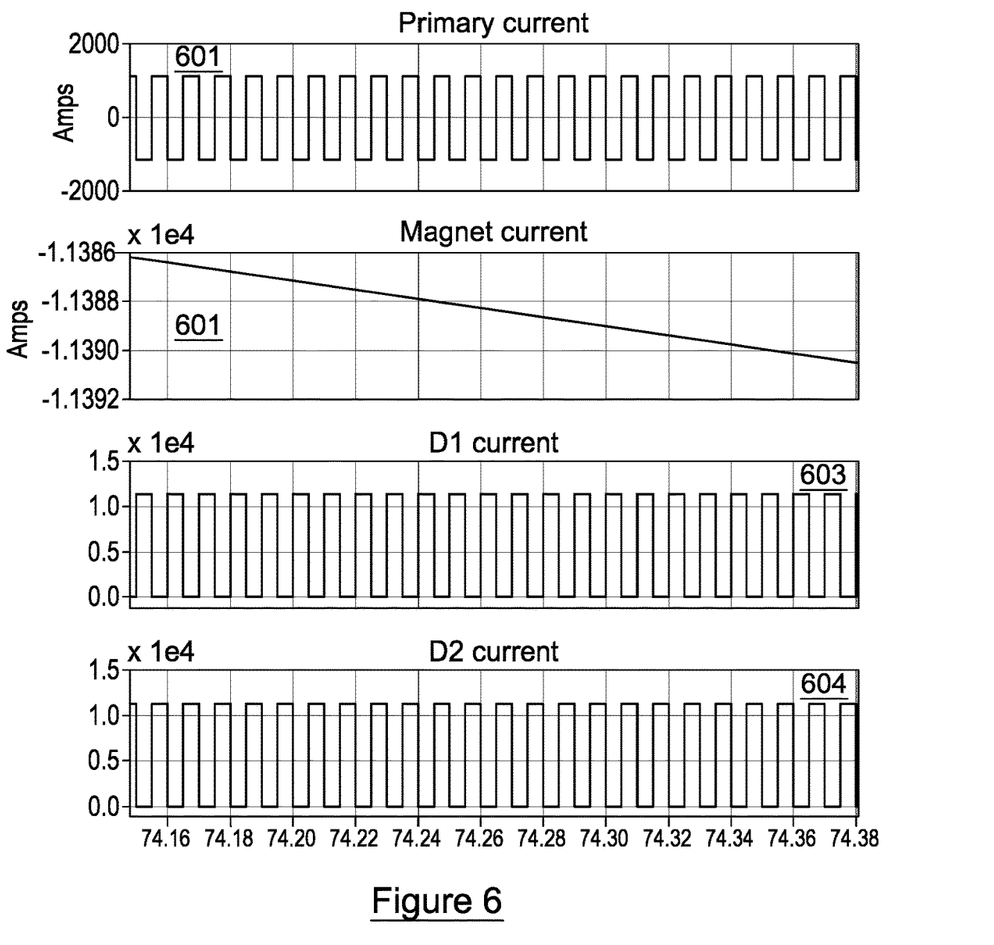
FIG. 6 shows graphs of properties of the power supply of FIG. 5.

FIG. 5 shows a circuit used for further simulations, the results of which are shown in FIG. 6. The SMPS in FIG. 5 has a full bridge converter topology. As before, the inductance L is the superconducting magnet coil, R2 is the joint resistance, and the capacitances 501, 502 on the secondary side are the natural capacitances of the magnet components. FIG. 6 shows the current 601 in the primary coil of the transformer Tr3, the current 602 in the magnet, and the currents 603, 604 in the diodes D1 and D2, which correspond to the currents in the respective secondaries of the transformer Tr2. Note that in FIG. 6, the current through the magnet is negative—so the downward slope indicates an increase in current.

Once the desired current is achieved, the duty cycle is dropped to maintain the desired current—this may be achieved by the controller using a feedback loop to monitor the current in the magnet and adjust the duty cycle accordingly (i.e. increase the duty cycle if the current falls, and reduce the duty cycle if the current climbs above the desired value).

An alternative way to control the power delivered to the load is to change the voltage supplied by DC voltage supply, V_dc, while keeping the duty cycle the same. As a further alternative, the voltage supplied by V_dc and duty cycle may be varied together to control the total power delivered.

If a localized quench is detected in any part of the magnet, then the resistance R1 is switched in by opening switch S1, and the current in the magnet quickly decays limiting dangerous heating in the quenched region. In this model the power supply is not deactivated but in practice this would be done when a quench is detected.

The term "cryostat" is used above to mean the insulated chamber in which the cryogenic temperature is maintained—normally a vacuum vessel. Where the SMPS is described as being "within the cryostat" above, this may refer to being within the same vacuum vessel as the magnet coil, or within a connected vacuum vessel. As an alternative, the SMPS may be placed within a separate cryostat which is cooled to a temperature intermediate between room temperature and the temperature of the magnet coils, or placed in a location within the magnet cryostat at such a temperature. Where the SMPS comprises superconducting (HTS or LTS) components, those components must be cooled to below the critical temperature of the superconductor.

While the background to this invention has been presented in terms of a fusion reactor, the skilled person will appreciate that the invention applies to any magnet comprising a superconducting coil, e.g. MRI magnets or magnets suitable for energy storage.

The invention claimed is:

1. A magnet assembly comprising:
    a superconducting coil;
    a cryogenic system comprising a cryostat and configured to maintain the superconducting coil within the cryostat at an operating temperature below the critical temperature of the superconductor;
    a DC voltage source located outside the cryostat;
    a switched mode power supply, SMPS, located inside the cryostat and configured to supply power from the DC voltage source to the superconducting coil, the SMPS comprising a voltage step-down transformer having a primary and a secondary winding;
    current leads connecting the DC voltage source to the SMPS;
    and a controller configured to cause the SMPS to supply a first amount of power to the magnet in order to ramp up the magnet to operating current, and a second amount of power to the magnet during steady state operation of the magnet, wherein the first amount of power is greater than the second amount of power.

2. A magnet assembly according to claim 1, wherein said transformer has non-isolated windings.

3. A magnet assembly according to claim 1, wherein said transformer has isolated windings.

4. A magnet assembly according to claim 1, wherein the transformer comprises a core of magnetically permeable material which links the windings.

5. A magnet assembly according to claim 1, wherein the transformer has an air core.

6. A magnet assembly according to claim 1, wherein the controller is configured to cause the SMPS to operate on a first duty cycle in order supply the first amount of power, and on a second duty cycle in order to supply the second amount of power, wherein the first duty cycle is greater than the second duty cycle.

7. A magnet assembly according to claim 1, wherein the controller is configured to cause the DC voltage source to supply a first voltage to the SMPS in order supply the first amount of power and a second voltage to the SMPS in order to supply the second amount of power, wherein the first voltage is greater than the second voltage.

8. A magnet assembly according to claim 1, wherein the superconducting coil acts as an energy storage inductor of the SMPS.

9. A magnet assembly according to claim 1, wherein at least the secondary winding of said transformer comprises superconducting material, and the cooling system is configured to maintain the superconducting material at or below a critical temperature of the superconducting material.

10. A magnet assembly according to claim 9, wherein the secondary winding of said transformer comprises a high temperature superconductor HTS.

11. A magnet assembly according to claim 1, wherein said SMPS has a topology which is one of:
    a forward converter;
    a push-pull converter;
    a half bridge converter; and
    a full-bridge converter.

12. A magnet assembly according to claim 1, wherein the switching speed of the SMPS is less than or equal to 1 kHz, more preferably less than or equal to 100 Hz, more preferably less than or equal to 10 Hz.

13. A magnet assembly according to claim 1, wherein the controller is configured to monitor current in the superconducting coil and to adjust the second amount of power supplied to the SMPS in order to maintain a substantially constant current in the superconducting coil when the magnet is in steady state operation.

14. A magnet assembly according to claim 1, wherein the superconducting coil comprises one or both of high temperature superconductor, HTS, and low temperature superconductor, LTS.

15. A magnet assembly comprising:
    a superconducting coil;
    a cryogenic system comprising a first cryostat configured to maintain the superconducting coil at an operating temperature below the critical temperature of the superconductor and a second cryostat configured to maintain a temperature between room temperature and the operating temperature, wherein the superconducting coil is within the first cryostat;
    a DC voltage source located at room temperature;
    a switched mode power supply, SMPS, configured to supply power from the DC voltage source to the superconducting coil, the SMPS comprising a voltage step-down transformer having a primary and a secondary winding, wherein the SMPS is located in the second cryostat;
    first current leads connecting the DC voltage source to the SMPS;
    second current leads connecting the SMPS to the magnet; and
    a controller configured to cause the SMPS to supply a first amount of power to the magnet in order to ramp up the magnet to operating current, and a second amount of power to the magnet during steady state operation of the magnet, wherein the first amount of power is greater than the second amount of power.

16. A magnet assembly comprising:
a superconducting coil;
a cryogenic system comprising a cryostat and configured to maintain the superconducting coil within the cryostat at an operating temperature below the critical temperature of the superconducting coil;
a DC voltage source located outside the cryostat;
a switched mode power supply, SMPS, configured to supply power from the DC voltage source to the superconducting coil, the SMPS comprising a voltage step-down transformer having a primary and a secondary winding, wherein the primary winding is located outside the cryostat and the secondary winding is located inside the cryostat;
current leads connecting the DC voltage source to the SMPS;
current leads connecting the secondary winding to the magnet;
and a controller configured to cause the SMPS to supply a first amount of power to the magnet in order to ramp up the magnet to operating current, and a second amount of power to the magnet during steady state operation of the magnet, wherein the first amount of power is greater than the second amount of power.

17. A magnet assembly according to claim 16, wherein said transformer is air cored and is a resonant transformer.

18. A magnet assembly according to claim 16, wherein said transformer comprises a core of magnetically permeable material which links the windings and which penetrates a wall of the cryostat.

19. A magnet assembly according to claim 18, wherein said core is formed from any one of:
iron;
amorphous steel; and
ferrite.

20. A method of providing power to a superconducting coil of a magnet assembly, wherein the magnet assembly comprises a cryostat in which the superconducting coil is provided, the method comprising:
providing a switched mode power supply, SMPS, wherein the SMPS comprises a voltage step-down transformer having a primary winding and a secondary winding, and the secondary winding is inside the cryostat of the magnet assembly;
energizing the magnet by supplying a first amount of power from a DC voltage source outside the cryostat to the coil via the SMPS; and
maintaining steady state operation of the magnet by supplying a second amount of power from the DC voltage source to the coil via the SMPS;
wherein the first amount of power is greater than the second amount of power.

21. A method according to claim 20, wherein the SMPS operates on a first duty cycle in order to supply the first amount of power, and a second duty cycle in order to supply the second amount of power, and the first duty cycle is less than the second duty cycle.

22. A method according to claim 20, wherein the DC voltage source provides a first voltage in order to supply the first amount of power, and a second voltage in order to supply the second amount of power, wherein the first voltage is less than the second voltage.

23. A method according to claim 20, wherein the primary winding is outside the cryostat.

24. A method according to claim 20, wherein the primary winding is inside the cryostat.

* * * * *